(12) United States Patent
Sto. Domingo

(10) Patent No.: US 8,784,621 B1
(45) Date of Patent: Jul. 22, 2014

(54) WAFER CARRIER COMPRISING A VARIABLE APERTURE SHIELD

(75) Inventor: Rico Sto. Domingo, Calamba (PH)

(73) Assignee: DECA Technologies Inc., Tempe, AZ (US)

(*) Notice: Subject to any disclaimer, the term of this patent is extended or adjusted under 35 U.S.C. 154(b) by 372 days.

(21) Appl. No.: 13/250,070

(22) Filed: Sep. 30, 2011

Related U.S. Application Data

(60) Provisional application No. 61/494,339, filed on Jun. 7, 2011, provisional application No. 61/540,238, filed on Sep. 28, 2011.

(51) Int. Cl.
*B23H 7/26* (2006.01)
*B23Q 1/00* (2006.01)

(52) U.S. Cl.
USPC ............... 204/297.05; 204/297.01; 269/52

(58) Field of Classification Search
USPC ............ 204/297.16, 297.07, 297.01, 297.05; 269/52, 48.1
See application file for complete search history.

(56) References Cited

U.S. PATENT DOCUMENTS

| | | | |
|---|---|---|---|
| 6,514,393 B1 * | 2/2003 | Contolini et al. | 204/297.03 |
| 7,022,211 B2 * | 4/2006 | Yoshioka et al. | 204/297.01 |
| 7,819,728 B2 * | 10/2010 | Beckley | 454/155 |
| 2006/0002702 A1 * | 1/2006 | Masuda et al. | 396/510 |

* cited by examiner

*Primary Examiner* — Luan Van
*Assistant Examiner* — Alexander W Keeling
(74) *Attorney, Agent, or Firm* — Booth Udall Fuller, PLC

(57) ABSTRACT

A wafer carrier is described. In one embodiment, the wafer carrier includes a variable aperture shield.

11 Claims, 7 Drawing Sheets

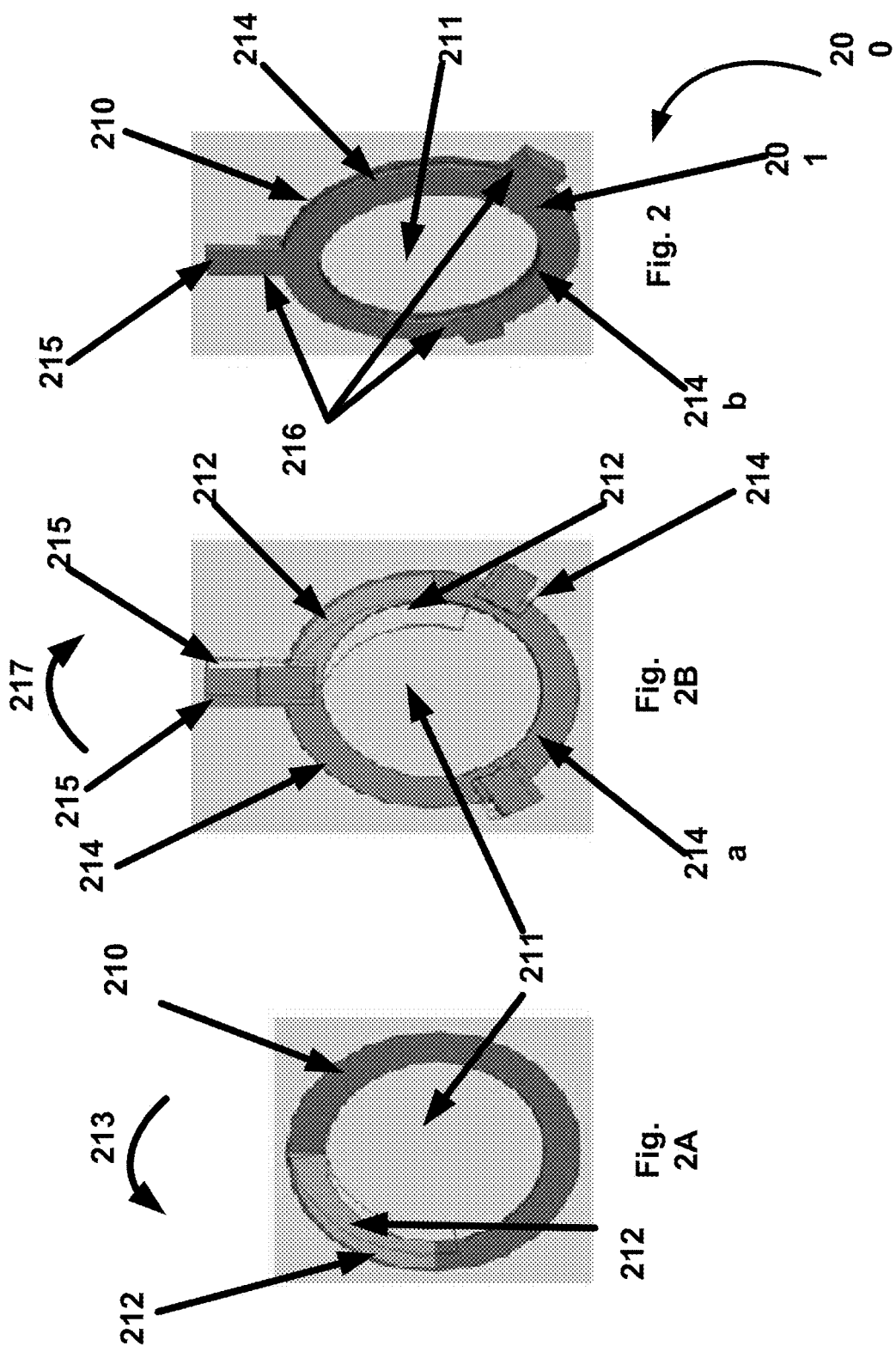

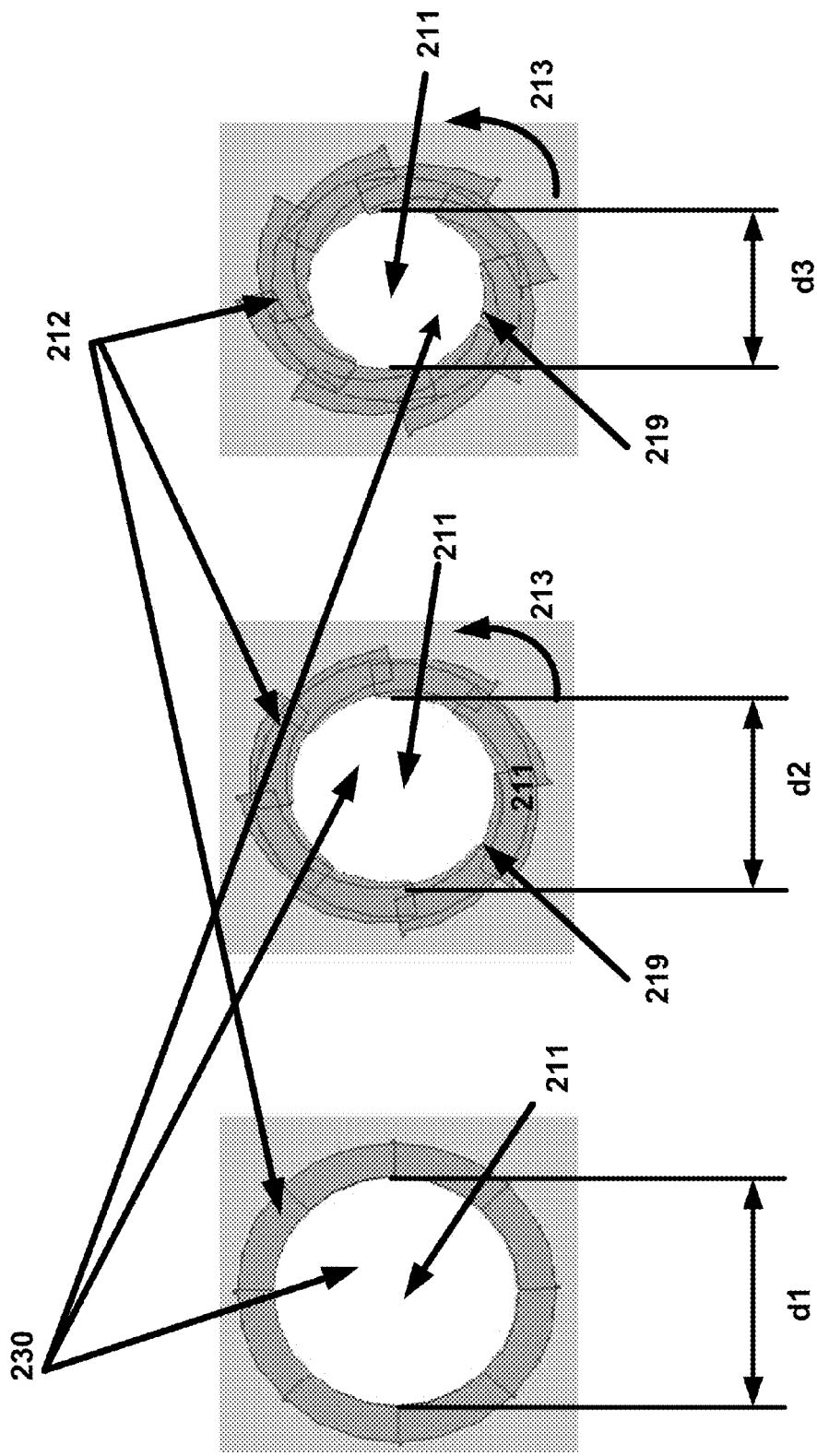

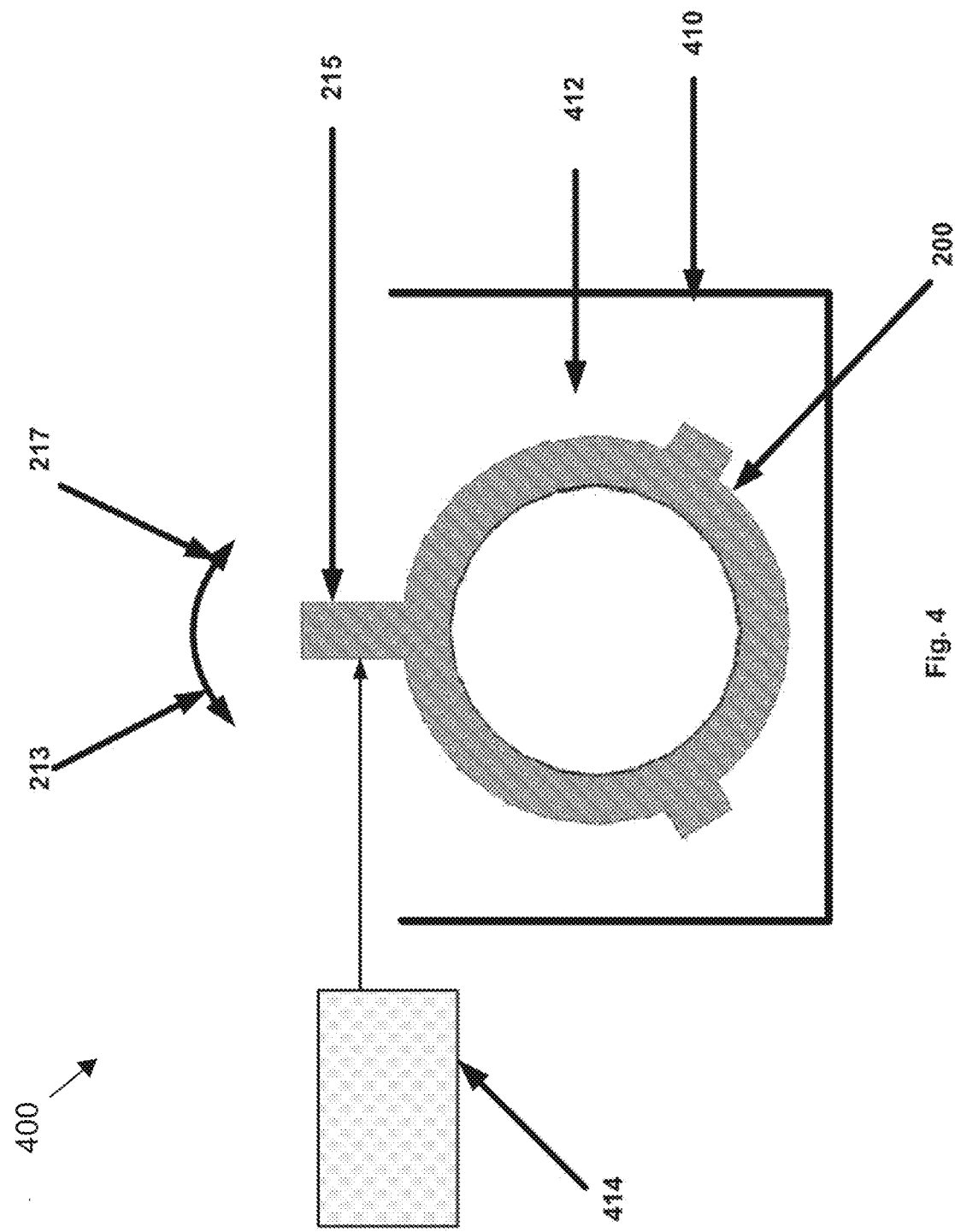

US 8,784,621 B1

WAFER CARRIER COMPRISING A VARIABLE APERTURE SHIELD

RELATED APPLICATIONS

This application claims the benefit of U.S. Provisional Application No. 61/494,339 filed on Jun. 7, 2011, the entire contents of which are hereby incorporated by reference. This application also claims the benefit of U.S. Provisional Application No. 61/540,238 filed on Sep. 28, 2011, the entire contents of which are hereby incorporated by reference.

TECHNICAL FIELD

This disclosure relates to the field of semiconductor device manufacturing and, in particular, to a wafer carrier for wafer plating.

BACKGROUND

Integrated circuits are formed through a process known as semiconductor device fabrication. The semiconductor device may be formed on a thin slice, or wafer, of semiconductor material, such as silicon crystal. The wafer serves as a substrate for microelectronic devices built on the wafer. During fabrication of these integrated circuits, the silicon wafer is put through a sequence of wet chemical processing steps. One wet chemical processing step in the sequence is electrochemical deposition, commonly known as electroplating.

In the electroplating process, electrical current is used to deposit metal ions from a solution onto a wafer, forming a film or patterned structure of metal on the wafer. Certain semiconductor packaging technologies, such as Wafer Level Chip Scale Packaging and Flip Chip, involve multiple electroplating steps. A proper size of a shield on the wafer holder is critical to achieve plating uniformity across the wafer surface during the electroplating process.

Currently, a wafer carrier 100 used for wafer plating is illustrated in FIG. 1. The wafer carrier 100 includes a wafer holder 110 and fixed size shield 112 mounted onto the wafer holder 110. The current method of shielding utilizes multiple fixed-size shields 112. Each of the fixed size shields 112 vary in size and dictate a fixed expose area for placement of a wafer 114. Since different sizes of the exposed area affect the plating uniformity, the fixed-size shields 112 have to be swapped during electroplating depending on the plating parameters. Swapping of the multiple fixed-size shields is commonly a manual operation which is tedious and lengthy. Also, the cost of creating such fixed-sized shields is very expensive. Further, locating the right fixed-size shield that matches the plating parameters is prone to error in wafer plating process.

BRIEF SUMMARY

Embodiments of wafer carriers can comprise a variable aperture shield.

Particular embodiments of wafer carriers can further comprise the variable aperture shield comprising a fixed base plate, and a plurality of fins forming the variable aperture, the plurality of fins mounted on the fixed base plate. The at least one of the plurality of fins can be configured to move towards or away from a center of the variable aperture to change a diameter of the variable aperture. The movement can comprise a rotation of at least one of the plurality of the fins. The rotation of the fins can comprise a simultaneous rotation of the plurality of fins. The plurality of fins can overlap a fin adjacent to the at least one of the plurality of the fins upon the rotation. The movement of the plurality of fins can comprise a convergence of the plurality of fins towards the center of the variable aperture. Each of the plurality of fins can comprise a pivot point configured to move the fin with respect to the fixed base plate. Each of the plurality of fins can comprise a lever point configured to move the fin towards or away from the center of the variable aperture. The variable aperture shield further comprising a cover plate mounted onto the fixed base plate. The cover plate can be clamped onto the fixed base plate to align a center of the cover plate with a center of the fixed base plate upon movement of the cover plate. The plurality of fins can be positioned between the fixed base plate and the cover plate. The cover plate can be configured to move the lever points of the fin.

BRIEF DESCRIPTION OF THE DRAWINGS

The present disclosure is illustrated by way of example, and not by way of limitation, in the figures of the accompanying drawings.

FIG. 2 is a diagram illustrating a wafer carrier according to an embodiment.

FIG. 2A is a diagram illustrating a variable aperture field of the wafer carrier of FIG. 2.

FIG. 2B is a diagram illustrating a variable aperture field of the wafer carrier of FIG. 2.

FIGS. 3A-3C are diagrams illustrating positions of the fins of the wafer carrier according to an embodiment.

FIG. 4 is a diagram illustrating system for wafer plating according to an embodiment.

DETAILED DESCRIPTION

Figure 1:
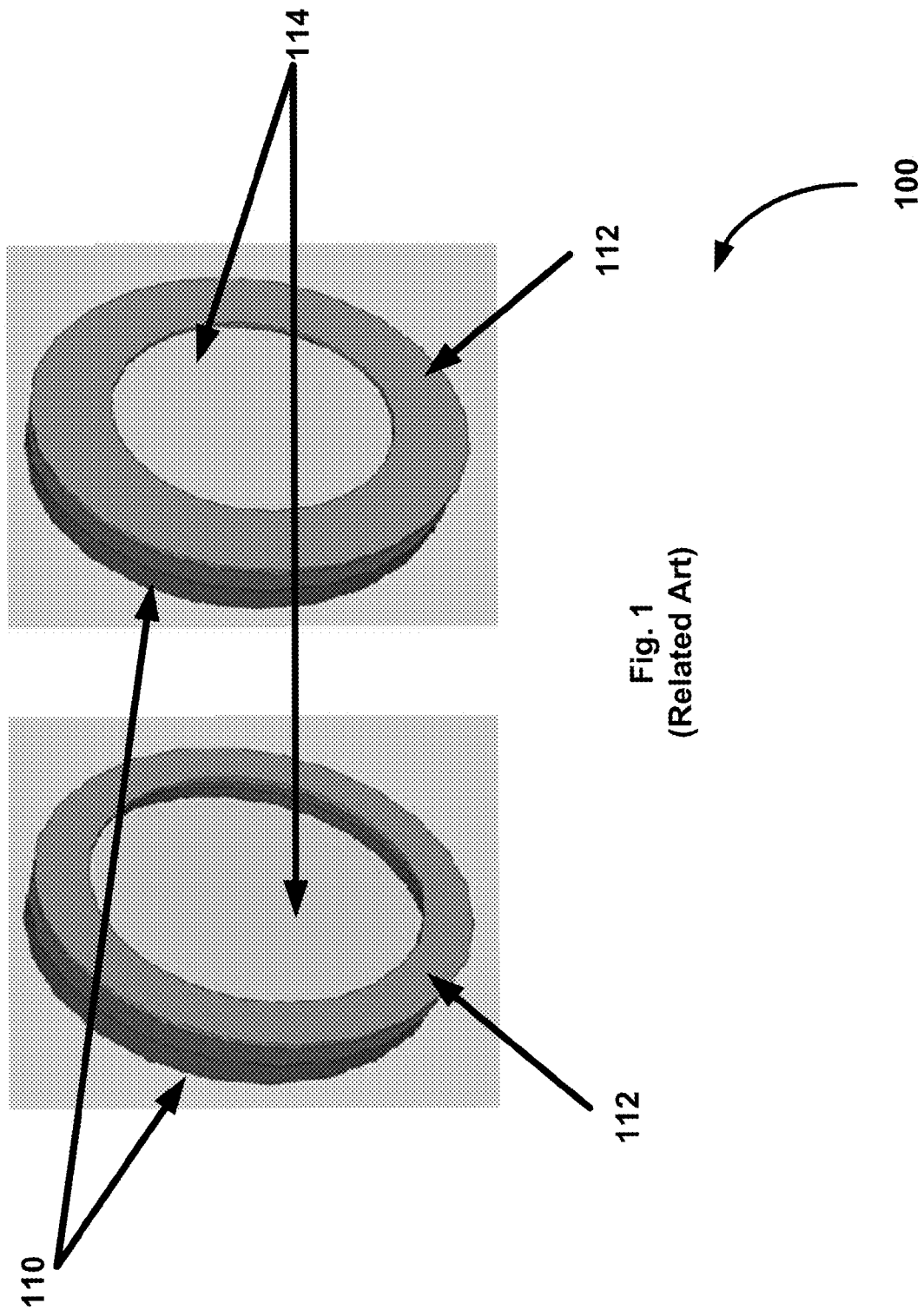
FIG. 1 is a diagram illustrating a conventional wafer carrier.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of an apparatus as described for a wafer carrier that provides the ability to perform wafer plating in an automated, low cost and time efficient manner. The wafer carrier allows for a single adjustable mechanism that changes the size of the exposed area of the wafer. In one embodiment, the wafer carrier includes a variable aperture shield. The variable aperture shield provides for a mechanism to change the size of the exposed area of the wafer as desired for wafer plating.

FIG. 2 illustrate a wafer carrier 200 according to an embodiment of the present invention. The wafer carrier 200 includes a variable aperture shield 201. The variable aperture shield includes a fixed base plate 210. In one embodiment, the fixed base plate 210 is formed of plastic or other non-conductive material, although in other embodiments, the fixed base plate 210 is formed from other materials such as ceramic or metal. The wafer carrier 200 also includes a plurality of fins 212 mounted onto the fixed base plate 210 forming a variable aperture 211 as shown in FIG. 2A. The variable aperture 211 provides for the exposed area for wafer plating. The fin 212 operates to move towards or away from a center of the variable aperture 211. In one embodiment, the fin 212 rotates in a counterclockwise direction 213 towards the center of the variable aperture 211 as illustrated by the line drawing of the fin 212 in FIG. 2A. In one embodiment, the fins 212 rotate simultaneously with respect to one another. In one embodiment, the fins 212 move rotationally, although in other embodiments, the fins 212 may have other types of motions such as linear, periodic, or circular motions. In one embodiment, the fin 212 is formed from plastic material or other non-conductive material, although in other embodiments, the fin 212 is formed from other materials such as ceramic or metal. The variable aperture shield 201 further includes a cover plate 214 secured to the fixed base plate 210 covering the fins 212 mounted on the fixed base plate 210. The cover plate 214 includes a rear side 214a and a front side 214b. In the configuration illustrated in FIG. 2, the rear side 214a is mounted to the fixed base plate 210 such that the fins 212 are placed between the fixed based plate 210 and the rear side 214a of the cover plate 214. In an alternate embodiment, the front side 214b is mounted to the fixed base plate 210 such that the fins 212 are mounted on the front side 214b of the cover plate 214.

In one embodiment, the cover plate 214 is secured to the fixed base plate 210 via clamps 216 as illustrated in FIG. 2, although in other embodiments, the cover plate 214 is pressed or clenched to the fixed base plate 210. The clamps 216 operate as guide rails such that when the cover plate 214 rotates, the center of the cover plate 214 will always align with the center of the fixed base plate 210 as shown in FIG. 2. In one embodiment, the cover plate 214 and the clamps are formed from plastic material or other non-conductive material which is not subject to built upon reduction during processing. Although in other embodiments, the cover plate 214 and the clamps 216 are formed from other materials such as ceramic or metal. As illustrated in FIG. 2, the cover plate 214 also includes a handle 215 used to rotate the cover plate 214 as will be described in greater detail below.

Figure 2C:
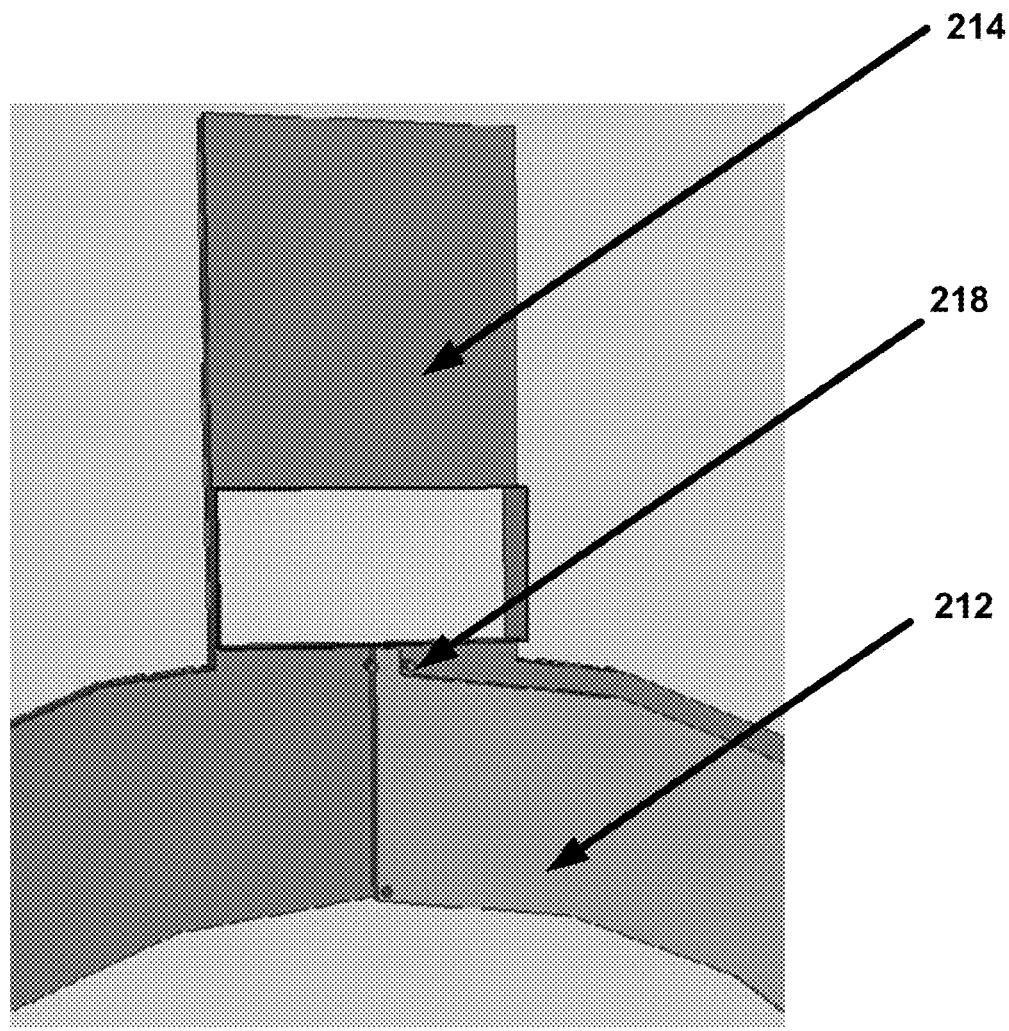
FIG. 2C is a diagram illustrating cross-section of FIG. 2B.

FIG. 2B illustrates a rear side of the cover plate 214 according to an embodiment of the present invention. The handle 215 is moved away from its original position in FIG. 2 in a clockwise direction 217 as illustrated by the line drawing of the handle 215 in FIG. 2B. This movement of the handle 215 causes the cover plate 214 to also rotate in the clockwise direction 217 as illustrated by the line drawing of the cover plate 214. This rotation of the cover plate 214 in turn pushes the fin 212 to also rotate in the clockwise direction 217 as illustrated by the line drawing of the fin 212 towards the center of the variable aperture 211 as illustrated by the line drawings of the fin 212 in FIG. 2B. Although not shown, the movement of the handle 215 in the opposite direction will cause the cover plate 214 to rotate the fin 212 away from the center of the variable aperture 211. Thus, the cover plate 214 operates to push or pull on the fin 212 toward or away from the center of the variable aperture 211. The embodiment described above provides for a rotational movement, although in other embodiments, other types of movements such as linear, periodic, or circular may be utilized for motion of the handle 215, the cover plate 214 and the fin 212. FIG. 2C shows a cross-section rear view of the cover plate 214. In one embodiment, pins 218 are placed on the rear side of the cover plate 214 to rotate the fin 212, although in other embodiments, a bar, notch or gear may be used in place of the pins. When cover plate 214 moves, the pin 218 moves with the cover plate 214 pushing or pulling on the fin 212 resulting in rotation and overlapping of the fins 212.

Figure 2D:
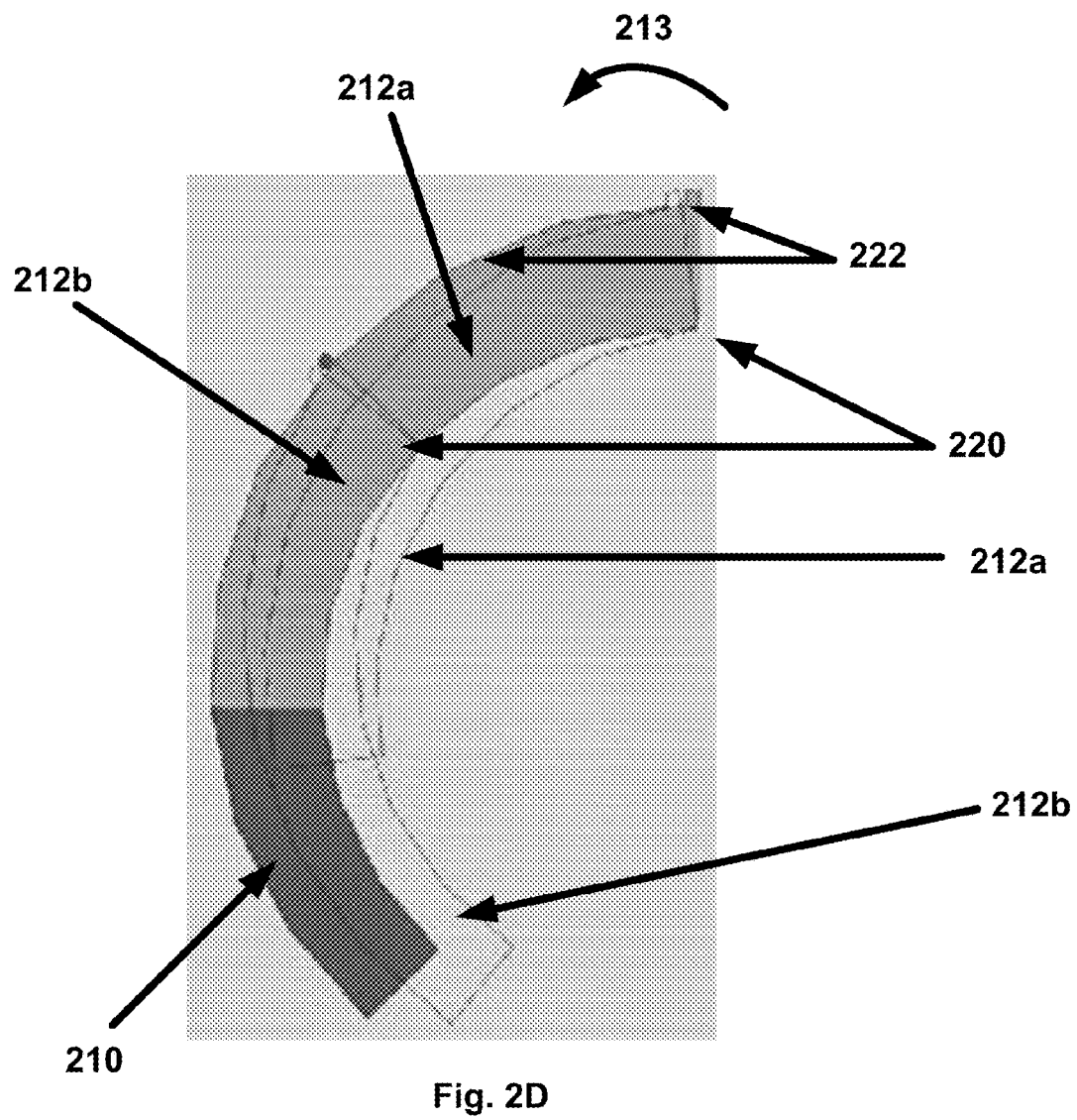
FIG. 2D is a diagram illustrating an enlarged view of a fin of the wafer carrier of FIG. 2.

FIG. 2D is a diagram illustrating fin 212a and fin 212b according to an embodiment of the present invention. Each of the fin 212a and fin 212b are mounted onto the fixed base plate 210 at a pivot point or fulcrum 220. This pivot point or fulcrum 220 allows the fin 212a to rotate in a counterclockwise direction 213 with respect to the fixed base plate 210. The fin 212a also include a lever point 222 located at one end of the fin 212a as shown in FIG. 2B. The rotation of the cover plate 214 pushes the lever points 222 of the fin 212a which enables fin 212a to rotate at its lever point 222. The rotation of the fin 212a causes the fin 212a to overlap with an adjacent fin, i.e. fin 212b. The fin 212b also rotates simultaneously with the fin 212a in the counterclockwise direction 213 as illustrated in FIG. 2B. This rotation and overlapping of the fins 212 result in changing diameter of the variable aperture 211 based on the desired sized required of the exposed area for wafer plating as will be described in greater detail below. FIGS. 3A-3C illustrates the rotation of the fins 212 of the variable aperture shield 201 of the wafer carrier 200 according to an embodiment of the present invention. As shown in FIG. 3A, fins 212 are positioned at zero degree rotation providing for the variable aperture 211 having a diameter d1 large in size desired for placement of a wafer 230. In FIG. 3B, a slight rotation of the cover plate 214 (not shown) in a counterclockwise direction 213 in turn slightly rotates the fins 212 in a counterclockwise direction 213 which causes the fins 212 to overlap one another. This rotation of the fins 212 pushes the fins 212 towards the center of the variable aperture 211 thus reducing the diameter d1 of the variable aperture 211 to diameter d2 as shown in FIG. 3B. This reduction in the diameter to d2 provides for a reduced size desired for placement of the wafer 230. In FIG. 3C, the fins 212 are further rotated in the counterclockwise direction 213 which causes further overlapping of the fins 212 and pushing the fins 212 further towards the center of the variable aperture 211. This further rotation of the fins 212 results in further reduction in the size of the diameter d2 of the center of the variable aperture 211 to the diameter d3. This further reduction in diameter d3 provides for a further reduced sized desired for placing the wafer 230. The rotation and the overlapping of the fins 212 cause the convergence of the fins 212 towards the center of the variable aperture 211. In one embodiment, the overlapping of the fins 212 causes the fins 212 to converge to form a circular shield 219 having a diameter although in other embodiments, the shield may have other shapes and sizes. The values of the d1, d2 and d3 vary based on the size of the wafer 230, the shape of the fin 212 and number of fins 212. In one example, the wafer 230 having an approximate size of 300 mm and depending on the shape and number of the fins, the value of diameter d1 may range between 260 mm to 300 mm, the value of diameter d2 may range between 230 mm to 260 mm, and the value of diameter d3 may range between 200 mm to 230 mm. In another example, a wafer having an approximate size of 200 mm wafer and depending on the shape and number of the fins, the value of diameter d1 may range between 160 nm to 200 mm, the value of diameter d2 may range between 130 mm to 160 mm, and the value of diameter d3 may range between 100 mm to 130 mm.

FIG. 4 illustrates a plating system 400 according to an embodiment of the present invention. The system includes a plating bath 410 having a plating solution 412. The wafer carrier 200 is placed in the plating bath 410 for wafer plating.

The fixed base plate 210 of the wafer carrier 200 is affixed to the plating bath 410 prevent any movement of the fixed base plate 210. The wafer carrier 200 is placed in the plating bath 410 such that the handle 215 of the cover plate 214 will be positioned above the plating bath 410 as shown in FIG. 4. The plating system 400 also includes a drive mechanism 414 coupled to the handle 215 of the wafer carrier 200. In one embodiment, the drive mechanism 414 is an operator manually moving the handle 215. In another embodiment, the drive mechanism 414 is a machine that operates to provide for automated movement of the handle 215. As illustrated in FIG. 4, the handle 215 is rotated in either the clockwise direction 217 or the counterclockwise direction 213. The diameter of the variable aperture 211 is based on a rotation of the cover plate 214, which in turn will have a corresponding handle position. So, the handle 215 is moved to a specific distance based upon the diameter size desired for the variable aperture 211 for placement of the wafer.

Figure 5:
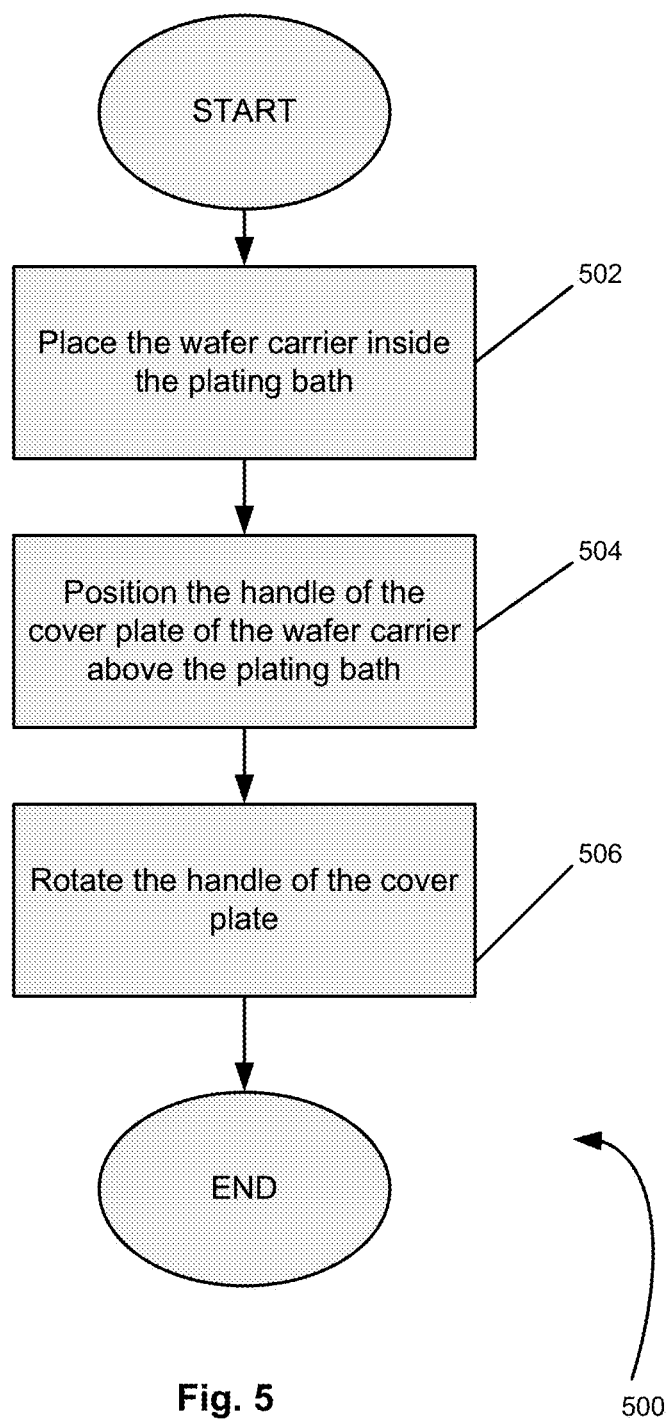
FIG. 5 is a flow chart illustrating a method for wafer plating according to and embodiment.

FIG. 5 is a flow diagram of one embodiment of a method for wafer plating. Hardware, software or combination of these components may be used to perform method 500. The method 500 starts from block 502 at which a wafer carrier 200 is placed inside the plating bath 410. At block 504, the handle 215 of the cover plate 214 of the wafer carrier is positioned above the plating bath 410. At block 506, the handle 215 is rotated via the drive mechanism 414. This rotation of the handle 215 in turn rotates the cover plate 214 which causes rotations of the fins 212.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

The particular features, structures or characteristics described herein may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A wafer carrier, comprising:
a variable aperture shield, the variable aperture shield further comprising:
 a cover plate,
 a fixed base plate, and
 a plurality of fins forming a variable aperture of the variable aperture shield, the plurality of fins mounted on the fixed base plate and disposed between the fixed base plate and the cover plate, wherein at least one of the plurality of fins is configured to move towards or away from a center of the variable aperture when the cover plate is moved such that at least one of the plurality of fins overlaps an adjacent fin and changes a diameter of the variable aperture.

2. The wafer carrier of claim 1 wherein the movement comprises a rotation of at least one of the plurality of the fins.

3. The wafer carrier of claim 2 wherein the rotation of the fins comprises a simultaneous rotation of the plurality of fins.

4. The wafer carrier of claim 1 wherein the movement of the plurality of fins comprises a convergence of the plurality of fins towards the center of the variable aperture.

5. The wafer carrier of claim 1 wherein each of the plurality of fins comprises a pivot point configured to move the fin with respect to the fixed base plate.

6. The wafer carrier of claim 1 wherein each of the plurality of fins comprises a lever point configured to move the fin towards or away from the center of the variable aperture.

7. The wafer carrier of claim 1 wherein the variable aperture shield further comprising a cover plate mounted onto the fixed base plate.

8. The wafer carrier of claim 7 wherein the cover plate is clamped onto the fixed base plate to align a center of the cover plate with a center of the fixed base plate upon movement of the cover plate.

9. The wafer carrier of claim 7 wherein the plurality of fins are positioned between the fixed base plate and the cover plate.

10. The wafer carrier of claim 7 wherein the cover plate is configured to move the lever points of the fin.

11. The wafer carrier of claim 7, wherein the cover plate comprises a handle configured to move the cover plate to change a diameter of the variable aperture, the handle further configured to be disposed outside a plating bath.

* * * * *